(12) United States Patent
We et al.

(10) Patent No.: US 10,311,935 B2
(45) Date of Patent: Jun. 4, 2019

(54) SEMICONDUCTOR DEVICE AND METHOD OF DRIVING THE SAME

(71) Applicant: SK hynix Inc., Gyeonggi-do (KR)

(72) Inventors: Woo-Sung We, Gyeonggi-do (KR); Hyun-Sung Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/907,484

(22) Filed: Feb. 28, 2018

(65) Prior Publication Data
US 2018/0254078 A1 Sep. 6, 2018

(30) Foreign Application Priority Data
Mar. 2, 2017 (KR) .................... 10-2017-0027065

(51) Int. Cl.
*G11C 11/406* (2006.01)
*G11C 11/4072* (2006.01)
*G11C 11/408* (2006.01)

(52) U.S. Cl.
CPC .......... *G11C 11/406* (2013.01); *G11C 11/408* (2013.01); *G11C 11/4072* (2013.01); *G11C 11/40611* (2013.01); *G11C 11/40618* (2013.01)

(58) Field of Classification Search
CPC ............. G11C 11/406; G11C 11/40611; G11C 11/40618; G11C 11/4072; G11C 11/408
USPC .......................................................... 365/222
See application file for complete search history.

(56) References Cited

U.S. PATENT DOCUMENTS

| 7,327,625 B2* | 2/2008 | Jo | G11C 11/406 365/222 |
| 9,030,897 B2* | 5/2015 | Song | G11C 8/14 365/200 |
| 2015/0043293 A1* | 2/2015 | Song | G11C 11/40618 365/222 |

FOREIGN PATENT DOCUMENTS

KR 1020150128087 11/2015

* cited by examiner

*Primary Examiner* — Fernando Hidalgo
(74) *Attorney, Agent, or Firm* — IP & T Group LLP

(57) ABSTRACT

A semiconductor device according to an embodiment includes a plurality of memory regions suitable for performing a refresh operation based on a row address signal; an initialization circuit suitable for generating an initialization pulse signal for each refresh period during which a refresh pulse signal toggles as many times as the number of the memory regions; a control circuit suitable for activating a control pulse signal based on the refresh pulse signal and a plurality of memory address signals corresponding to the memory regions, and deactivating the control pulse signal based on the initialization pulse signal; and a row address generation circuit suitable for sequentially generating the row address signal based on the control pulse signal.

20 Claims, 5 Drawing Sheets

SEMICONDUCTOR DEVICE AND METHOD OF DRIVING THE SAME

CROSS-REFERENCE TO RELATED APPLICATION

This application claims priority under 35 U.S.C. § 119 to Korean Patent Application No. 10-2017-0027065, filed on Mar. 2, 2017, in the Korean Intellectual Property Office, the disclosure of which is incorporated herein by reference in its entirety.

TECHNICAL FIELD

Various exemplary embodiments of the present disclosure relate to a semiconductor design technique, and more particularly, to a semiconductor device and a method of driving the same.

DISCUSSION OF THE RELATED ART

In a semiconductor device, such as dynamic random access memory (DRAM), data stored in a memory cell are lost over time. This is because data stored in the memory cell leak due to the structural characteristics of the memory cell. Accordingly, the DRAM performs a refresh operation for rewriting data stored in the memory cell at regular intervals in order to prevent the data from being lost. The refresh operation is configured such that, during a retention time of the memory cell, a word line connected to the memory cell is activated to an active state at least once and the data stored in the memory cell are amplified. Here, the retention time is the time during which data stored in the memory cell may be retained without loss.

The refresh operation includes an all-bank refresh operation and a single bank refresh operation. The all-bank refresh operation is performed for a plurality of banks in response to each refresh command inputted from an external device (for example, a controller), and the single bank refresh operation is performed for any one of the banks in response to each refresh command. Here, a "bank" is a unit of a memory region including a plurality of memory cells.

Particularly, the single bank refresh operation requires a bank address signal for selecting any one of the banks, and the bank address signal may be generated sequentially or randomly during each refresh period.

However, the bank address signal may be omitted or erroneously generated due to configuration error, circuit error, operation error, or the like. In this case, the corresponding bank skips the single bank refresh operation, whereby a problem in which data stored in the corresponding bank are lost may be caused.

SUMMARY

Various embodiments are directed to provide a semiconductor device in which, even if some bank address signals are omitted or erroneously generated, a refresh operation for a corresponding bank is normally performed before data stored therein are lost, and a method of driving the semiconductor device.

In an embodiment, a semiconductor device may include a plurality of memory regions suitable for performing a refresh operation based on a row address signal; an initialization circuit suitable for generating an initialization pulse signal for each refresh period during which a refresh pulse signal toggles as many times as the number of the memory regions; a control circuit suitable for activating a control pulse signal based on the refresh pulse signal and a plurality of memory address signals corresponding to the memory regions, and deactivating the control pulse signal based on the initialization pulse signal; and a row address generation circuit suitable for sequentially generating the row address signal based on the control pulse signal.

The control circuit may activate the control pulse signal when the memory address signals are normally generated for the each refresh period.

The row address generation circuit may change the row address signal when the control pulse signal is activated.

The control circuit may maintain the control pulse signal in a deactivated state when at least one of the memory address signals is erroneously generated for the each refresh period.

The row address generation circuit may maintain the row address signal without change when the control pulse signal is deactivated.

The initialization circuit may count a toggling number of the refresh pulse signal, and generate the initialization pulse signal when the toggling number of the refresh pulse signal reaches the number of the memory regions.

The initialization circuit may include: at least one frequency division unit suitable for generating at least one refresh frequency division signal by dividing a frequency of the refresh pulse signal at a preset frequency division ratio; and a first logic unit suitable for generating the initialization pulse signal by performing a logic operation on the refresh pulse signal and the refresh frequency division signal.

The first logic unit may perform a NAND operation on the refresh pulse signal and the refresh frequency division signal.

The control circuit may include: a plurality of latch units suitable for latching the memory address signals based on the refresh pulse signal and suitable for being initialized based on the initialization pulse signal; and a second logic unit suitable for generating the control pulse signal by performing a logic operation on a plurality of latch address signals latched in the latch units.

The second logic unit may perform an AND operation on the latch address signals.

In another embodiment, a method for driving a semiconductor device may include, for each refresh period, sequentially generating a plurality of memory address signals corresponding to a plurality of memory regions and generating a refresh pulse signal that toggles as many times as the number of the memory regions; for the each refresh period, activating an initialization pulse signal depending on a toggling number of the refresh pulse signal; for the each refresh period, generating a control pulse signal based on the refresh pulse signal and the memory address signals, and initializing the control pulse signal based on the initialization pulse signal; for the each refresh period, generating a row address signal based on the control pulse signal; and for the each refresh period, performing a refresh operation for the memory regions based on the row address signal.

The initialization pulse signal may be activated when the toggling number of the refresh pulse signal reaches the number of the memory regions.

The control pulse signal may be activated when the memory address signals are normally generated.

The row address signal may be changed when the control pulse signal is activated.

The control pulse signal may be maintained in a deactivated state when at least one of the memory address signals is erroneously generated.

The row address signal may be maintained without change when the control pulse signal is deactivated.

In another embodiment, a semiconductor device may include a plurality of memory regions suitable for performing a refresh operation for each refresh period, based on a plurality of memory address signals respectively corresponding to the memory regions, and a row address signal; a control circuit suitable for activating a control pulse signal when the memory address signals are normally generated for the each refresh period; and a row address generation circuit suitable for generating the row address signal while changing the row address signal when the control pulse signal is activated.

The each refresh period may include a period during when a toggling number of a refresh pulse signal reaches the number of the memory regions, and the control circuit may deactivate the control pulse signal for a certain time before the each refresh period is ended.

The control circuit may maintain the control pulse signal in a deactivated state when at least one of the memory address signals is erroneously generated for the each refresh period.

The row address generation circuit may maintain the row address signal without a change when the control pulse signal is deactivated.

DETAILED DESCRIPTION

Figure 1:
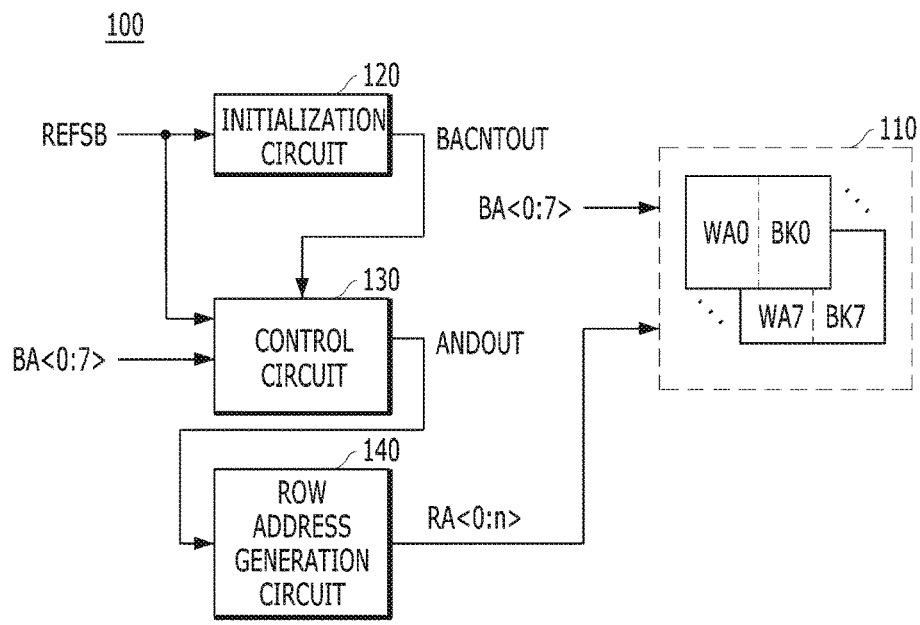
FIG. 1 is block diagram illustrating a semiconductor device in accordance with an embodiment of the present disclosure.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In an embodiment, a bank, which is a unit of a memory region, is illustrated, and an example in which first to eighth banks are included is illustrated.

FIG. 1 is block diagram illustrating a semiconductor device 100 in accordance with an embodiment of the present invention.

Referring to FIG. 1, the semiconductor device 100 may include a memory circuit 110, an initialization circuit 120, a control circuit 130, and a row address generation circuit 140.

The memory circuit 110 may perform a refresh operation based on first to n+1-th row address signals RA<0:$n$> and first to eighth memory address signals (hereinafter, referred to as "bank address signals") BA<0:7>. For example, the refresh operation may include a single bank refresh operation.

For example, the memory circuit 110 may include first to eighth banks BK0 to BK7. The memory circuit 110 may perform the single bank refresh operation on the first to eighth banks BK0 to BK7 based on the first to n+1-th row address signals RA<0:$n$> and the first to eighth bank address signals BA<0:7>. For example, the first to eighth banks BK0 to BK7 may be sequentially refreshed based on the first to n+1-th row address signals RA<0:$n$> and the first to eighth bank address signals BA<0:7>.

The first to eighth banks BK0 to BK7 may include first to eighth word line activation units WA0 to WA7, respectively. The first to eighth word line activation units WA0 to WA7 may sequentially activate at least one word line, which is connected to each of the first to eighth banks BK0 to BK7, based on the first to n+1-th row address signals RA<0:$n$> and the first to eighth bank address signals BA<0:7>.

The initialization circuit 120 may generate an initialization pulse signal BACNTOUT based on a refresh pulse signal REFSB. The initialization circuit 120 may activate the initialization pulse signal BACNTOUT for a certain time whenever the refresh pulse signal REFSB toggles as many times as the number of the first to eighth banks Bk0 to BK7. For example, the initialization circuit 120 may count the number of times the refresh pulse signal REFSB toggles (hereinafter, referred to as "the toggling number"), and may activate the initialization pulse signal BACNTOUT when the toggling number of the refresh pulse signal REFSB reaches eight. Hereinafter, a period during which the refresh pulse signal REFSB toggles eight times is called a "refresh period".

The control circuit 130 may generate a control pulse signal ANDOUT based on the refresh pulse signal REFSB, the first to eighth bank address signals BA<0:7>, and the initialization pulse signal BACNTOUT. For example, the control circuit 130 may activate the control pulse signal ANDOUT based on the refresh pulse signal REFSB and the first to eighth bank address signals BA<0:7>, and may deactivate the control pulse signal ANDOUT based on the initialization pulse signal BACNTOUT. Here, the control circuit 130 may activate the control pulse signal ANDOUT when all of the first to eighth bank address signals BA<0:7> are activated for each refresh period.

The row address generation circuit 140 may sequentially generate first to n+1-th row address signals RA<0:$n$> based on the control pulse signal ANDOUT. The row address generation circuit 140 may change the first to n+1-th row address signals RA<0:$n$> or maintain them without change for each refresh period. For example, the row address generation circuit 140 may change the first to n+1-th row address signals RA<0:$n$> when the control pulse signal ANDOUT is activated, but may maintain the first to n+1-th row address signals RA<0:$n$> without change when the control pulse signal ANDOUT is deactivated.

Figure 2:
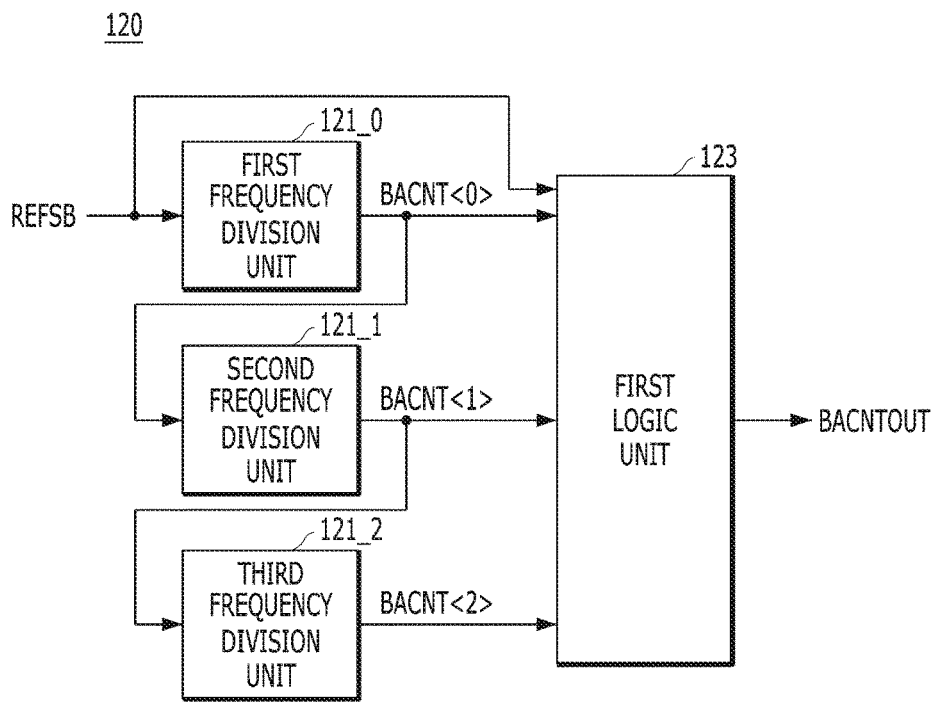
FIG. 2 is a block diagram illustrating an initialization circuit illustrated in FIG. 1.

FIG. 2 is a block diagram illustrating the initialization circuit 120 illustrated in FIG. 1.

Referring to FIG. 2, the initialization circuit 120 may include first to third frequency division units 121_0 to 121_2 and a first logic unit 123.

The first to third frequency division units 121_0 to 121_2 may generate first to third refresh frequency division signals BACNT<0:2> by dividing the frequency of the refresh pulse signal REFSB at a preset division ratio. For example, the first frequency division unit 121_0 may generate the first refresh frequency division signal BACNT<0> by dividing the frequency of the refresh pulse signal REFSB by two, the second frequency division unit 121_1 may generate the second refresh frequency division signal BACNT<1> by dividing the frequency of the first refresh frequency division signal BACNT<0> by two, and the third frequency division unit 121_2 may generate the third refresh frequency division signal BACNT<2> by dividing the frequency of the second refresh frequency division signal BACNT<1> by two.

The first logic unit 123 may generate the initialization pulse signal BACNTOUT by performing a logic operation on the refresh pulse signal REFSB and the first to third refresh frequency division signals BACNT<0:2>. For example, the first logic unit 123 may perform a NAND operation on the refresh pulse signal REFSB and the first to third refresh frequency division signals BACNT<0:2>. When the first logic unit 123 is configured as a NAND gate, the first logic unit 123 may activate the initialization pulse signal BACNTOUT to a logic high level when all of the refresh pulse signal REFSB and the first to third refresh frequency division signals BACNT<0:2> are at a logic low level.

Figure 3:
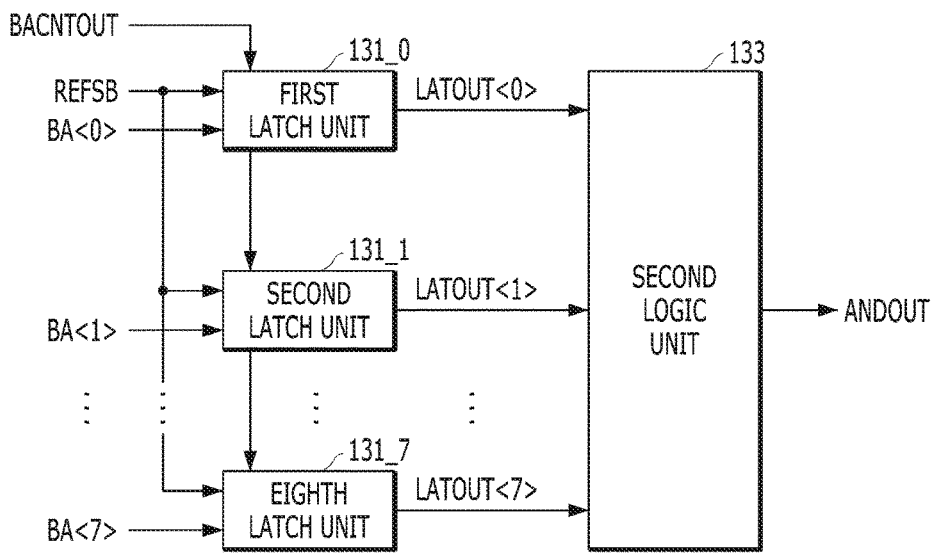
FIG. 3 is a block diagram illustrating a control circuit illustrated in FIG. 1.

FIG. 3 is a block diagram illustrating the control circuit 130 illustrated in FIG. 1.

Referring to FIG. 3, the control circuit 130 may include first to eighth latch units 131_0 to 131_7 and a second logic unit 133.

The first to eighth latch units 131_0 to 131_7 may sequentially latch the first to eighth bank address signals BA<0:7> based on the refresh pulse signal REFSB, and may be simultaneously initialized based on the initialization pulse signal BACNTOUT. For example, the first to eighth latch units 131_0 to 131_7 may generate first to eighth latch address signals LATOUT<0:7> corresponding to the first to eighth bank address signals BA<0:7> at a logic high level or a logic low level, and may reset the first to eighth latch address signals LATOUT<0:7> to a logic low level based on the initialization pulse signal BACNTOUT.

The second logic unit 133 may generate the control pulse signal ANDOUT by performing a logic operation on the first to eighth latch address signals LATOUT<0:7>. For example, the second logic unit 133 may perform an AND operation on the first to eighth latch address signals LATOUT<0:7>. The second logic unit 133 may include an AND gate.

Figure 4:
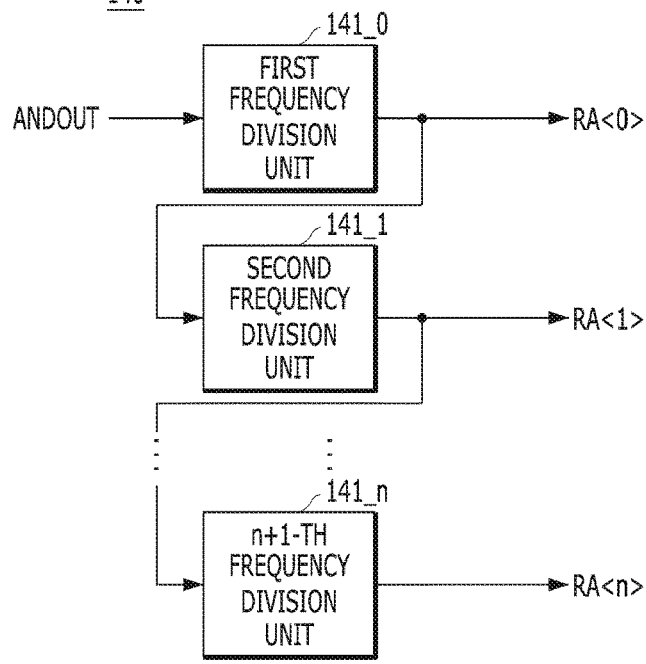
FIG. 4 is a block diagram illustrating a row address generation circuit illustrated in FIG. 1.

FIG. 4 is a block diagram illustrating the row address generation circuit 140 illustrated in FIG. 1.

Referring to FIG. 4, the row address generation circuit 140 may include first to n+1 frequency division units 141_0 to 141_n.

The first to n+1-th frequency division units 141_0 to 141_n may generate the first to n+1-th row address signals RA<0:n> based on the control pulse signal ANDOUT. For example, the first frequency division unit 141_0 may generate the first row address signal RA<0> by dividing the frequency of the control pulse signal ANDOUT by two, the second frequency division unit 141_1 may generate the second row address signal RA<1> by dividing the frequency of the first row address signal RA<0> by two, and the n+1-th frequency division unit 141_n may generate the n+1-th row address signal RA<n> by dividing the frequency of an n-th row address signal RA<n−1> by two.

Hereinafter, an operation of the semiconductor device 100 configured as described above according to an embodiment will be described with reference to FIGS. 5 to 8.

Figure 5:
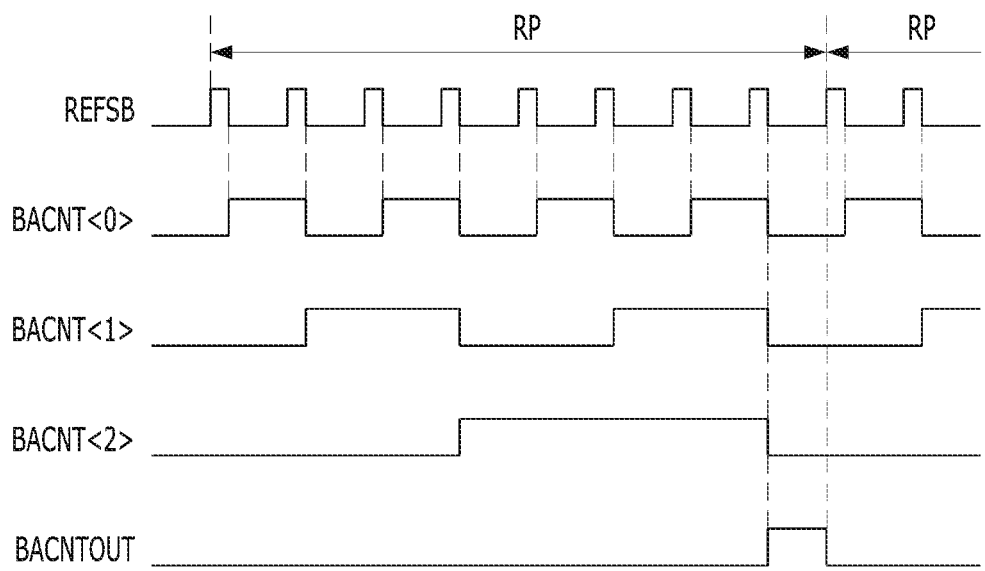
FIGS. 5 to 8 are diagrams for explaining an operation of the semiconductor device illustrated in FIG. 1.

FIG. 5 is a timing diagram for describing an operation of the initialization circuit 120.

Referring to FIG. 5, the initialization circuit 120 may activate the initialization pulse signal BACNTOUT for a certain time when the toggling number of the refresh pulse signal REFSB reaches the number of the first to eighth banks BK0 to BK7. For example, the initialization circuit 120 may count the toggle number of the refresh pulse signal REFSB, and may activate the initialization pulse signal BACNTOUT for a certain time when the toggle number of the refresh pulse signal REFSB becomes eight. Specifically, the first to third frequency division units 121_0 to 121_2 may respectively generate the first to third refresh frequency division signals BACNT<0:2> by dividing the frequency of the refresh pulse signal REFSB by two, four, and eight. Also, the first logic unit 123 may generate the initialization pulse signal BACNTOUT by performing a NAND operation on the refresh pulse signal REFSB and the first to third refresh frequency division signals BACNT<0:2>. Here, the initialization pulse signal BACNTOUT may be activated to a logic high level when all of the refresh pulse signal REFSB and the first to third refresh frequency division signals BACNT<0:2> are at a logic low level. That is, the initialization pulse signal BACNTOUT may be activated for a certain time in each refresh period RP.

Figure 6:
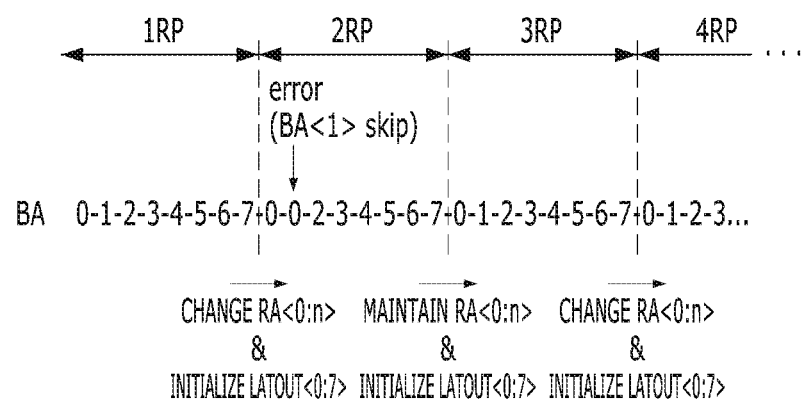

FIG. 6 is a reference drawing describing a refresh period RP and a bank address signal BA that is erroneously inputted, prior to a description of an operation of the control circuit 130 and the row address generation circuit 140.

Referring to FIG. 6, the refresh period RP may include a period during which the refresh pulse signal REFSB toggles eight times. Hereinafter, a period during which the refresh pulse signal REFSB toggles first eight times after entry into a refresh mode is defined as a first refresh period 1RP, and a period during which the refresh pulse signal REFSB toggles the next eight times is sequentially defined as a second refresh period 2RP, a third refresh period 3RP, and a fourth refresh period 4RP.

During each of the first to fourth refresh periods 1RP, 2RP, 3RP, and 4RP, first to eighth bank address signals BA<0:7> may be sequentially generated. Here, at least one of the first to eighth bank address signals BA<0:7> may be unintentionally omitted or may be erroneously generated. Hereinafter, an example in which, among the first to eighth bank address signals BA<0:7>, the second bank address signal BA<1> is erroneously generated in the second refresh period 2RP will be described. In this case, because all of the first to eighth bank address signals BA<0:7> are normally generated in the first refresh period 1RP, the first to n+1-th row address signals RA<0:n> may be changed when entering the second refresh period 2RP. On the other hand, because the second bank address signal BA<1> is erroneously generated in the second period 2RP among the first to eighth bank address signals BA<0:7>, the first to n+1-th row address signals RA<0:n> may be maintained without change when entering the third refresh period 3RP. This is intended to perform, in the third refresh period 3RP, a refresh operation for memory cells included in the second bank BK1, for which the refresh operation was skipped in the second refresh period 2RP because the erroneously generated second bank address signal BA<1> causes the refresh operation for memory cells corresponding to the first to n+1-th row address signals RA<0:n>, among memory cells included in the second bank BK1, to be skipped in the second refresh period 2R. Hereinafter, the operation corresponding to the first and second refresh periods 1RP and 2RP will be described in detail based on the description of FIG. 6.

Figure 7:
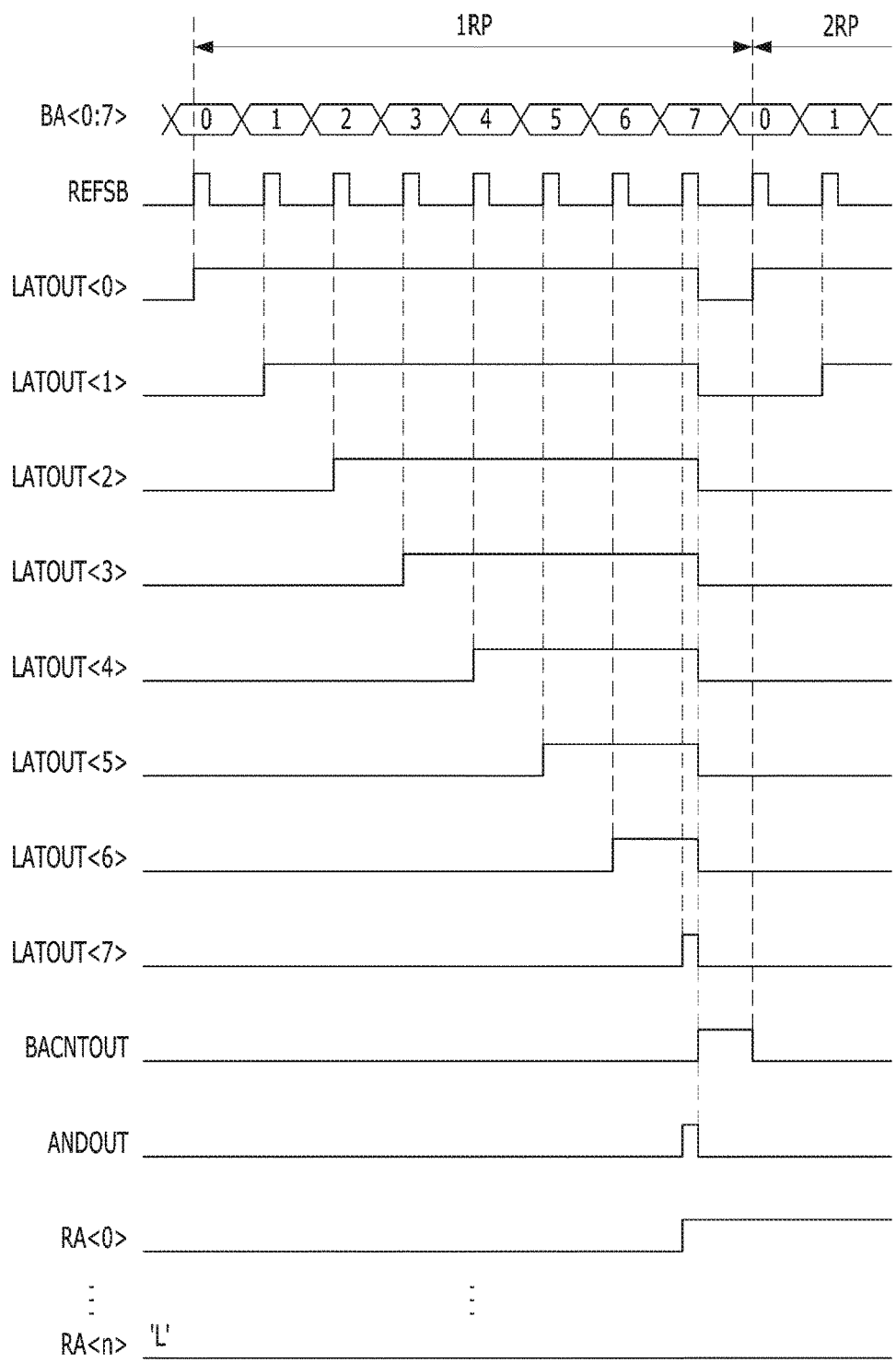

FIG. 7 is a timing diagram describing an operation of the control circuit 130 and the row address generation circuit 140 during the first refresh period 1RP.

Referring to FIG. 7, during the first refresh period 1RP, the first to eighth bank address signals BA<0:7> may be sequentially generated, and the refresh pulse signal REFSB may toggle eight times in response to the first to eighth bank address signals BA<0:7>.

The control circuit 130 may sequentially generate the first to eighth latch address signals LATOUT<0:7> based on the refresh pulse signal REFSB and the first to eighth bank address signals BA<0:7>. For example, based on the refresh pulse signal REFSB, the control circuit 130 may sequentially generate the first to eighth latch address signals LATOUT<0:7> of a logic high level, corresponding to the normally generated first to eighth bank address signals BA<0:7>. Also, the control circuit 130 may simultaneously generate the first to eighth latch address signals LATOUT<0:7> of a logic low level when the initialization pulse signal BACNTOUT is activated to a logic high level. That is, the first to eighth latch address signals LATOUT<0:7> may be initialized. Meanwhile, the control circuit 130 may activate the control pulse signal ANDOUT to a logic high level when all of the first to eighth latch address signals LATOUT<0:7> are at a logic high level.

The row address generation circuit 140 may change the first to n+1-th row address signals RA<0:$n$> based on the activated control pulse signal ANDOUT. For example, the row address generation circuit 140 may generate the first to n+1-th row address signals RA<0:$n$> of a logic low level during the first refresh period 1RP, and may generate the first row address signal RA<0> of a logic high level and the second to n+1-th row address signals RA<1:$n$> of a logic low level during the second refresh period 2RP. The row address generation circuit 140 may generate the first row address signal RA<0> of a logic high level and the second to n+1-th row address signals RA<1:$n$> of a logic low level when entering the second refresh period 2RP.

Figure 8:
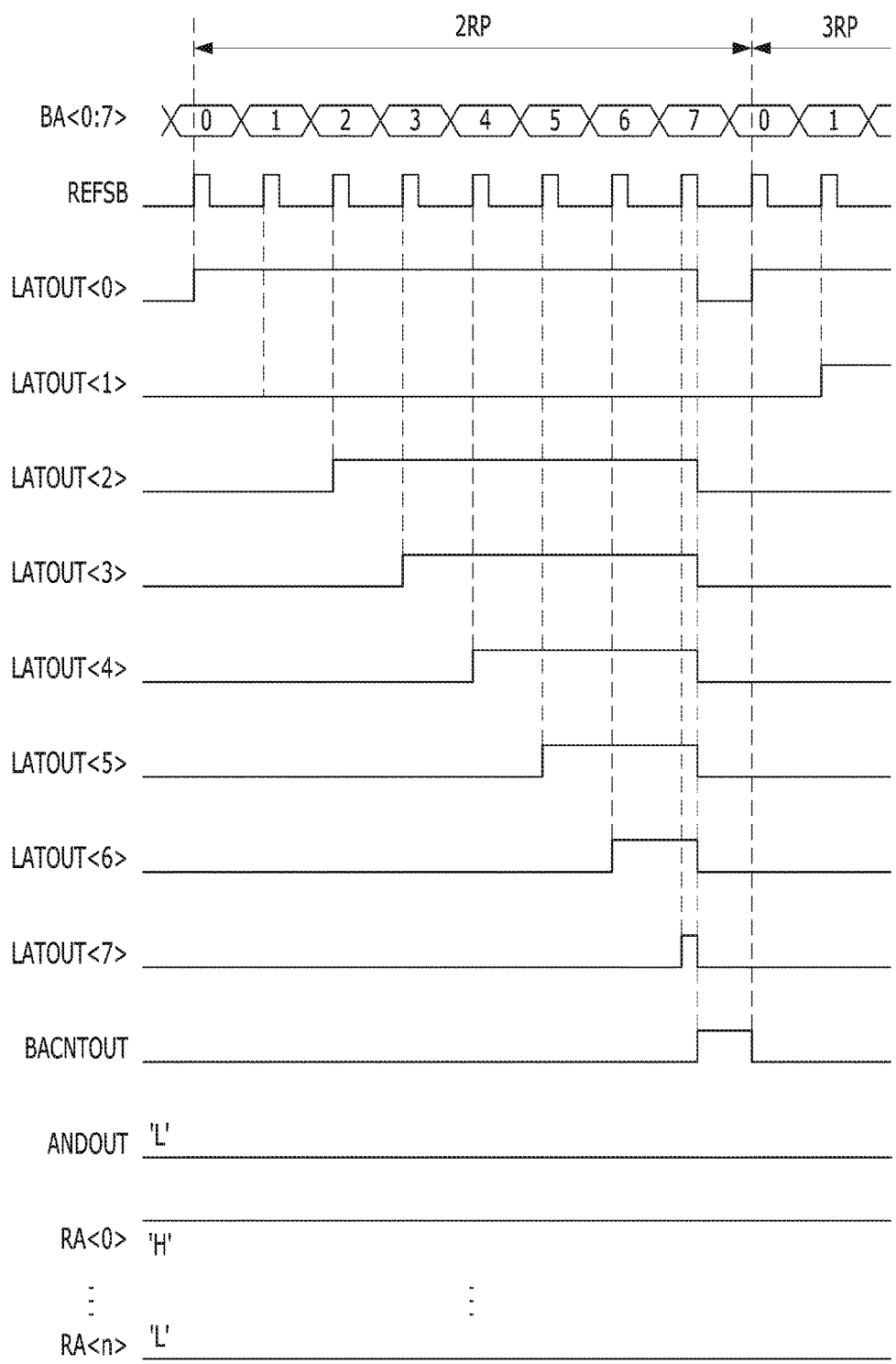

FIG. 8 is a timing diagram describing an operation of the control circuit 130 and the row address generation circuit 140 during the second refresh period 2RP.

Referring to FIG. 8, during the second refresh period 2RP, the first to eighth bank address signals BA<0:7> may be sequentially generated, and the refresh pulse signal REFSB may toggle eight times in response to the first to eighth bank address signals BA<0:7>.

The control circuit 130 may sequentially generate the first to eighth latch address signals LATOUT<0:7> based on the refresh pulse signal REFSB and the first to eighth bank address signals BA<0:7>. For example, based on the refresh pulse signal REFSB, the control circuit 130 may sequentially generate the first latch address signal LATOUT<0> and the third to eighth latch address signals LATOUT<2:7> of a logic high level, which respectively correspond to the normally generated first bank address signal BA<0> and the normally generated third to eighth bank address signals BA<2:7>, excluding the erroneously generated second bank address signal BA<1>. Here, the control circuit 130 may maintain the second latch address signal LATOUT<1> at a logic low level based on the erroneously generated second bank address signal BA<1>. Also, the control circuit 130 may initialize the first to eighth latch address signals LATOUT<0:7> to a logic low level when the initialization pulse signal BACNTOUT is activated to a logic high level.

Meanwhile, the control circuit 130 may maintain the control pulse signal ANDOUT at a logic low level because the second latch address signal LATOUT<1> is at a logic low level. That is, the control pulse signal ANDOUT may be consistently deactivated during the second refresh period 2RP.

The row address generation circuit 140 may not change but maintain the first to n+1-th row address signals RA<0:$n$> based on the deactivated control pulse signal ANDOUT. For example, the row address generation circuit 140 may generate the first row address signal RA<0> of a logic high level and the second to eighth row address signals RA<1:7> of a logic low level during the second refresh period 2RP, and may maintain the first to n+1-th row address signals RA<0:$n$> without change during the third refresh period 3RP.

According to an embodiment described as above, even if a bank address signal is erroneously generated, the refresh operation for a corresponding bank is performed again during the next refresh period, whereby it is advantageous in that data stored in the corresponding bank may not be lost.

According to an embodiment of the present disclosure, even if some bank address signals are omitted or erroneously generated, the refresh operation of a corresponding bank is normally performed before data stored therein are lost, whereby the operating reliability of a semiconductor device may be improved.

Although various exemplary embodiments have been described for illustrative purposes, it will be apparent to those skilled in the art that various changes and modifications may be made without departing from the spirit and scope of the invention as defined in the following claims.

For example, a bank address signal has been described as being sequentially generated for each refresh period in an embodiment of the present disclosure, but without limitation thereto, the present disclosure may be applied when the bank address signal is randomly generated for each refresh period.

What is claimed is:

1. A semiconductor device, comprising:
    a plurality of memory regions suitable for performing a refresh operation based on a row address signal;
    an initialization circuit suitable for generating an initialization pulse signal for each refresh period during which a refresh pulse signal toggles as many times as the number of the memory regions;
    a control circuit suitable for activating a control pulse signal based on the refresh pulse signal and a plurality of memory address signals corresponding to the memory regions, and deactivating the control pulse signal based on the initialization pulse signal; and
    a row address generation circuit suitable for sequentially generating the row address signal based on the control pulse signal.

2. The semiconductor device of claim 1, wherein the control circuit activates the control pulse signal when the memory address signals are normally generated for the each refresh period.

3. The semiconductor device of claim 2, wherein the row address generation circuit changes the row address signal when the control pulse signal is activated.

4. The semiconductor device of claim 1, wherein the control circuit maintains the control pulse signal in a deactivated state when at least one of the memory address signals is erroneously generated for the each refresh period.

5. The semiconductor device of claim 4, wherein the row address generation circuit maintains the row address signal without change when the control pulse signal is deactivated.

6. The semiconductor device of claim 1, wherein the initialization circuit counts a toggling number of the refresh pulse signal, and generates the initialization pulse signal when the toggling number of the refresh pulse signal reaches the number of the memory regions.

7. The semiconductor device of claim 1, wherein the initialization circuit comprises:
　at least one frequency division unit suitable for generating at least one refresh frequency division signal by dividing a frequency of the refresh pulse signal at a preset frequency division ratio; and
　a first logic unit suitable for generating the initialization pulse signal by performing a logic operation on the refresh pulse signal and the refresh frequency division signal.

8. The semiconductor device of claim 7, wherein the first logic unit performs a NAND operation on the refresh pulse signal and the refresh frequency division signal.

9. The semiconductor device of claim 1, wherein the control circuit comprises:
　a plurality of latch units suitable for latching the memory address signals based on the refresh pulse signal and suitable for being initialized based on the initialization pulse signal; and
　a second logic unit suitable for generating the control pulse signal by performing a logic operation on a plurality of latch address signals latched in the latch units.

10. The semiconductor device of claim 9, wherein the second logic unit performs an AND operation on the latch address signals.

11. A method of driving a semiconductor device, comprising:
　for each refresh period, sequentially generating a plurality of memory address signals corresponding to a plurality of memory regions and generating a refresh pulse signal that toggles as many times as the number of the memory regions;
　for the each refresh period, activating an initialization pulse signal depending on a toggling number of the refresh pulse signal;
　for the each refresh period, generating a control pulse signal based on the refresh pulse signal and the memory address signals, and initializing the control pulse signal based on the initialization pulse signal;
　for the each refresh period, generating a row address signal based on the control pulse signal; and
　for the each refresh period, performing a refresh operation for the memory regions based on the row address signal.

12. The method of claim 11, wherein the initialization pulse signal is activated when the toggling number of the refresh pulse signal reaches the number of the memory regions.

13. The method of claim 11, wherein the control pulse signal is activated when the memory address signals are normally generated.

14. The method of claim 13, wherein the row address signal is changed when the control pulse signal is activated.

15. The method of claim 11, wherein the control pulse signal is maintained in a deactivated state when at least one of the memory address signals is erroneously generated.

16. The method of claim 15, wherein the row address signal is maintained without change when the control pulse signal is deactivated.

17. A semiconductor device, comprising:
　a plurality of memory regions suitable for performing a refresh operation for each refresh period, based on a plurality of memory address signals respectively corresponding to the memory regions, and a row address signal;
　a control circuit suitable for activating a control pulse signal when the memory address signals are normally generated for the each refresh period; and
　a row address generation circuit suitable for generating the row address signal while changing the row address signal when the control pulse signal is activated.

18. The semiconductor device of claim 17, wherein the each refresh period includes a period during when a toggling number of a refresh pulse signal reaches the number of the memory regions, and
　the control circuit deactivates the control pulse signal for a certain time before the each refresh period is ended.

19. The semiconductor device of claim 18, wherein the control circuit maintains the control pulse signal in a deactivated state when at least one of the memory address signals is erroneously generated for the each refresh period.

20. The semiconductor device of claim 19, wherein the row address generation circuit maintains the row address signal without a change when the control pulse signal is deactivated.

* * * * *